(12) United States Patent
Bietsch et al.

(10) Patent No.: US 7,446,057 B2
(45) Date of Patent: Nov. 4, 2008

(54) FABRICATION METHOD

(75) Inventors: Alexander Bietsch, Ruschlikon (CH); Bruno Michel, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/574,150

(22) PCT Filed: Aug. 23, 2004

(86) PCT No.: PCT/IB2004/002724
§ 371 (c)(1),
(2), (4) Date: Feb. 8, 2007

(87) PCT Pub. No.: WO2005/031855
PCT Pub. Date: Apr. 7, 2005

(65) Prior Publication Data
US 2007/0275556 A1    Nov. 29, 2007

(30) Foreign Application Priority Data
Sep. 29, 2003    (EP)    ............................ 03021935

(51) Int. Cl.
*H01L 21/20* (2006.01)
(52) U.S. Cl. ................ 438/781; 438/946; 257/E21.579
(58) Field of Classification Search ................ 438/781, 438/946; 257/E21.579
See application file for complete search history.

(56) References Cited

U.S. PATENT DOCUMENTS 6,247,986 B1 *  6/2001  Chiu et al.  ..................... 445/24

* cited by examiner

*Primary Examiner*—Trung Dang
(74) *Attorney, Agent, or Firm*—Stephen C. Kaufman; Anne Vachon Dougherty

(57) ABSTRACT

A method for forming a multilevel structure on a surface by depositing a curable liquid layer on the surface; pressing a stamp having a multilevel pattern therein into the liquid layer to produce in the liquid layer a multilevel structure defined by the pattern; and, curing the liquid layer to produce a solid layer having the multilevel structure therein. Mechanical alignment may be employed to enhance optical alignment of the stamp relative to the substrate via spaced protrusions on the substrate on which the structure is to be formed and complementary recesses in the patterning of the stamp.

17 Claims, 4 Drawing Sheets

FABRICATION METHOD

FIELD OF THE INVENTION

The present invention generally relates to fabrication methods for forming multilevel structures and particularly relates to methods for forming electrically conductive structures in substrates.

BACKGROUND OF THE INVENTION

In semiconductor manufacturing technology, there is pressure to increase a real density and manufacturing speed and simultaneously to reduce manufacturing cost. The scaling of semiconductor devices on integrated circuit (IC) chips, and Complementary Metal Oxide Semiconductor (CMOS) transistor devices in particular, is reaching into the sub-micrometer region, generally following Moore's law. The number of devices integrated into an IC chip is of the order of tens of millions and increasing. Interconnection of signals between these devices now involves many layers of metal interconnections separated from each either by dielectric materials. Eight interconnection layers are usual at present. However, the number of layers is expected to increase. As IC dimensions reduce, RC time constants associated with resistance in and parasitic capacitance between the interconnections increase. This is because spacing between ground planes and signal lines reduces and the resistance of the signal lines increases. These effects limit switching speed in the IC.

In conventional ICs, the interconnects are formed from Aluminium typically by subtractive reactive ion etching. In more recent IC designs, the interconnects are formed from Copper. Copper provides less resistance than Aluminum and increased reliability. However, Copper interconnects cannot be formed easily by subtractive reactive ion etching. Instead, Copper interconnects are typically formed via a process called Dual Damascene. In the Dual Damascene process, a cylindrical hole is etched in an inter-layer dielectric (ILD), followed by a trench. The hole and trench are then filled with copper. The copper filling is then polished back by a chemical mechanical polishing (CMP) operation. This produces a copper via connection extending orthogonally from a lateral, inlaid copper signal line.

In detail, Dual Damascene usually involves deposition on a substrate of a first silicon nitride layer, a first layer of dielectric on the first silicon nitride layer, a second silicon nitride etch stop layer on the first dielectric layer, a second dielectric layer on the second silicon nitride layer, and a final hard mask layer. The substrate is then coated with photo resist and lithographically patterned. The ILD electrical properties are the average of the two dielectric layers and the two silicon nitride layers. An anisotropic dry etch cuts through the final layer and the two dielectric layers, stopping on the first silicon nitride layer. The photo resist is then stripped to leave a via in the ILD layer. The hard mask layer protects the ILD from the photo resist stripping process. Photo resist is again applied to the substrate and lithographically patterned. A trench etch then cuts through the ILD to the etch stop layer. The first silicon nitride layer is then opened by another etch. The photo resist is stripped. A tantalum barrier is deposited to line the hole/trench structure. The barrier prevents copper from diffusing into the ILD. A copper seed layer is then deposited using PVD. Bulk Copper is then deposited by electroplating. The copper deposition is polished back by CMP to the top of the trench. This process may be repeated to build up additional interconnection layers.

A disadvantage with Dual Damascene is that, during the second application of resist, usually by spinning, resist material pools in the vias. This creates local regions of extra thick resist on areas in which the vias are to be patterned. Additionally, because the features to be etched are relatively deep, it is difficult to achieve depths of focus desired for efficient photolithography. Economically, the relatively large number of steps involved make Dual Damascene very expensive to perform.

Parasitic capacitance between interconnects can be reduced by forming the dielectric layers from low-k dielectric materials. SiLK (trade mark of the Dow Chemical Company) is one well-known example of such a material. However, such low-k dielectric materials are not compatible with Dual Damascene. This is because low k dielectrics are in general susceptible to the same chemical processes that strip resist in Dual Damascene.

Another conventional technique for shaping materials on a substrate is Ultra Violet (UV) imprint lithography or UV molding. Referring to FIG. 1, in UV imprint lithography, a layer of a low viscosity pre-polymer liquid resist 110 is applied to a substrate 100. At step 2, a transparent patterned stamp 120 is pressed into the resist 110. The resist 110 is exposed to UV through the stamp 120. The exposed resist 110 cures and hardens. At step 3, the stamp 120 is removed from the patterned solidified resist 110. The substrate 100 is then peeled to leave the hardened resist 110 with thicker and thinner zones corresponding to the pattern of the stamp 120. The imprint in the resist layer 110 is substantially a replica of the pattern on the stamp 120. See, for example, M. Colburn et al. "Patterning non-flat substrates with a low pressure, room temperature imprint process", J. Vac. Sci. Technol. B, 6, 2161 (2001). UV imprint lithography permits molding of polymer features with a relatively high aspect ratio and vertical side walls. Alignment between the stamp 120 and the substrate 100 can be achieved optically through the stamp. See, for example, Choi et al, "Layer-to-layer alignment for step and flash imprint lithography", SPIE, 2001; White and Wood, "Novel alignment system for imprint lithography", J. Vac. Sci. Technol. 18, 3552, 2000). UV imprint lithography may also be performed with an elastomeric stamp. See, for example, Bietsch and Michel, "Conformal contact and pattern stability of stamps used for soft lithography", J. Appl. Phys. 88, 4310 (2000); Johnson, *Contact Mechanics*, Cambridge University Press, Cambridge (1985); and S. P. Timoshenko and J. N. Goodier, *Theory of Elasticity*, Mc-Graw-Hill, New York.

However, it is difficult to fully displace the resist on relatively large areas to achieve a pattern with satisfactory contrast. There is usually a residual layer left. Calculations for displacement of liquids can be derived from lubrication theory. See, for example A. Cameron, *Basic Lubrication Theory* Wiley, New York (1981). Relatively thin residual layers can be trivially removed by ashing. Ashing can remove a defined layer of polymer from both the protruding and depressed zones. Ashing provides access to the substrate in desired zones to create a binary contrast similar to that conventionally provided by resist patterning.

SUMMARY OF THE INVENTION

In accordance with the present invention, there is now provided a method for forming a multilevel structure on a surface, the method comprising: depositing a curable liquid layer on the surface; pressing a stamp having a multilevel pattern therein into the liquid layer to produce in the liquid layer a multilevel structure defined by the pattern; and, curing the liquid layer to produce a solid layer having the multilevel structure therein.

The method preferably comprises, prior to the pressing, aligning the stamp relative to the surface via complementary formations on the stamp and the surface. The aligning preferably comprises lubricating movement of the stamp relative to the surface via the liquid layer. The complementary formations may comprise protrusions on one of the stamp and the surface and recesses for receiving the protrusions on the other of the stamp and the surface. In particularly preferred embodiments of the present invention, the stamp is formed from an elastomeric material. The aligning may then comprise stretching the stamp. In preferred embodiments of the present invention, the protrusions are offset relative to the corresponding recesses to produce the stretching of the stamp. Alternatively, the stamp may be formed from a rigid material.

The solid layer may be formed from a dielectric material and the multilevel structure may comprise a multilevel cavity in the solid layer. In an alternative, the solid layer is formed from a resist material, the multilevel structure comprises a multilevel cavity in the solid layer, and the depositing comprises depositing the resist material in liquid form on a dielectric layer. Etching of the dielectric layer may then be employed via the solid resist layer to transfer the cavity from the solid layer to the dielectric layer. In either case, metal may be deposited in the cavity to produce a conductive structure embedded in dielectric material. In a preferred embodiment of the present invention, the cavity comprises a first level corresponding to a longitudinal element of the conductive structure and a second level corresponding to a lateral element of the conductive structure. The longitudinal element preferably comprises a via for completing an electrical connection between adjacent levels of a multilevel interconnection structure for an integrated circuit, and the lateral element preferably comprises a wire for completing an electrical connection within one of the adjacent levels of the integrated circuit. The present invention extends to a method for fabricating an integrated circuit having a multilevel interconnection structure, the method comprising, between at least one pair of adjacent levels of the interconnection structure, forming an electrically conductive structure by performing a method as herein before described.

The curing preferably comprises exposing the liquid layer to ultra violet light via the stamp.

In a preferred embodiment of the present invention, UV molding is employed in fabrication of multilevel interconnect structures in an IC. UV molding can advantageously replace with a single molding step the plural steps associated with conventional interconnect formation processes. In a particularly preferred embodiment of the present invention, this is achieved via a multilevel molding stamp. The stamp leaves a corresponding multilevel imprint in a polymer layer on a substrate. In one aspect, the present invention provides a UV molding process for simultaneously patterning vias and conductor trenches in a polymer resist followed by transfer of the pattern in the resist to an underlying dielectric material. In another aspect, the present invention provides a UV molding method for simultaneously patterning vias and trenches directly into a dielectric material. UV molding processes embodying the present invention permit fabrication of complex multilevel interconnect structures with reduced net RC time constant and reduced manufacturing complexity for a given number of interconnect levels. In a preferred embodiment of the present invention to be described shortly, UV-molding lithography is employed to create two level patterns in a UV curable dielectric material such as low-k dielectric material. The molded material is then coated with liners and catalysts to facilitate fabrication of via connections and interconnects.

BRIEF DESCRIPTION OF THE INVENTION

Preferred embodiments of the present invention will now be described, by way of example only, with reference to the accompanying drawings, in which.

DETAILED DESCRIPTION OF THE INVENTION

Figure 1:
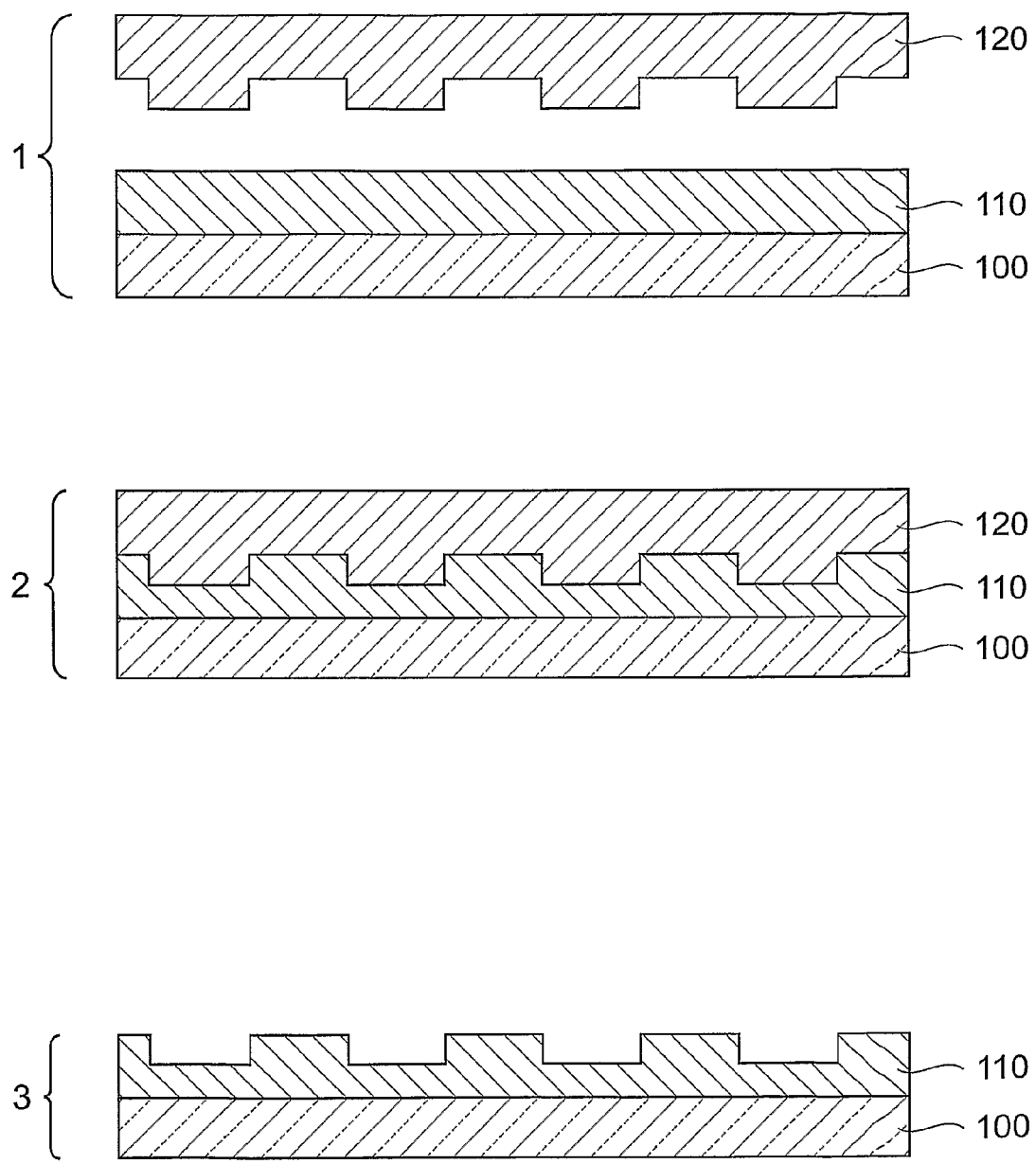
FIG. 1 is a block diagram of a conventional UV molding process.
Figure 2:
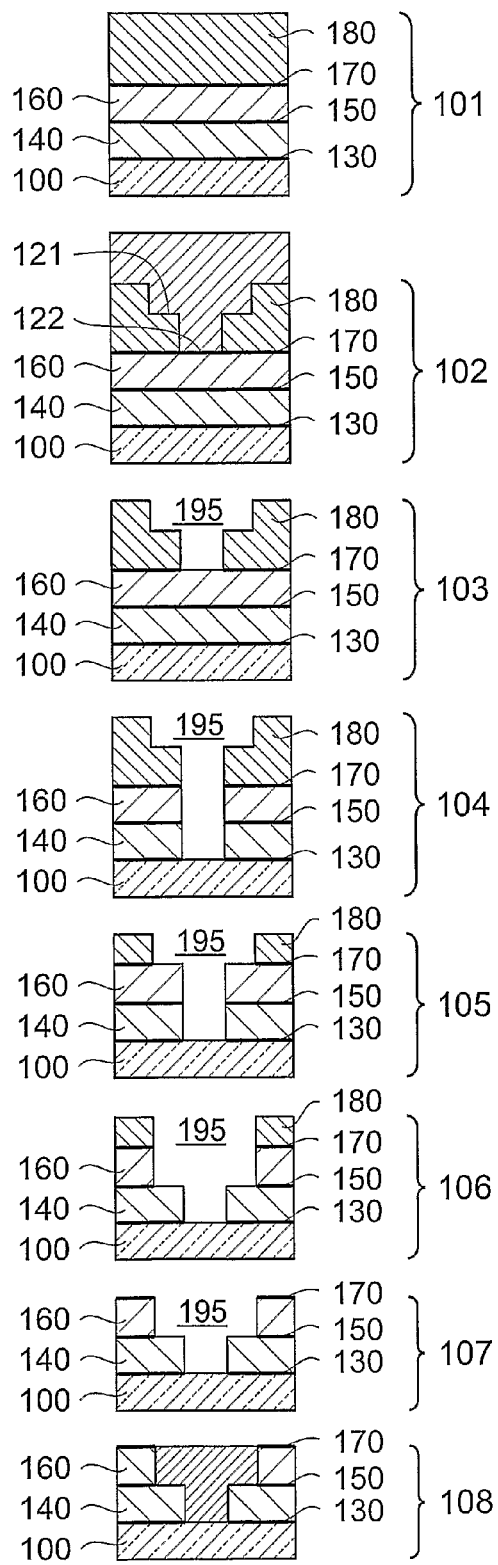
FIG. 2 is a block diagram of a UV molding process embodying the present invention.

Referring to FIG. 2, in one embodiment of the present invention, at step 101, a diffusion barrier layer 130 is deposited on the substrate 100. The diffusion barrier layer 130 covers both dielectric and vias or wire connections previously fabricated for connection to a subsequently attached layer of devices. A first homogeneous dielectric layer 140 is deposited on the diffusion barrier 130. A homogeneous silicon nitride etch stop layer 150 is deposited on the first dielectric layer 140. A second homogeneous dielectric layer 160 is deposited on the etch stop layer 150. A silicon nitride hard coat layer 170 is deposited on the second dielectric layer 160. A homogeneous layer of the liquid pre-polymer resist 180 is deposited on the hard coat layer 170. The dielectric layers 140 and 160 may be formed from the aforementioned SiLK material available from the Dow Chemical Company. Deposition of the resist layer 180 may be achieved by spray coating, spin coating, pipetting or via a roller coater. Other deposition techniques are possible. The resist layer 180 may be acrylate based or urethane based. Such resist materials are readily available from, for example, Master Bond, Inc., or Star Tec, Inc.

At step 102, transparent patterned stamp 120 is pressed into the resist layer 180. The pattern of the stamp 120 is then aligned with the substrate in lubricated contact with the resist layer 180. Alignment may be performed optically through the stamp 120. Optical alignment reaches sufficient accuracy for larger far back end of the line patterns (>100 nm), while, for smaller back end of the line patterns, accuracies of the order of 30-100 nm are desirable, which require adaptive alignment described below. Following alignment, the pattern from the stamp 120 is imprinted in the resist layer 180. The pattern comprises a first level 121 and a second level 122. The patterned resist layer 180 is then solidified by UV exposure through the stamp 120.

At step 103, the stamp 120 is separated from the molded resist layer 180. Any residual layer of resist is removed by ashing. The second, lower level 122 of the pattern is coincident with the hard coat layer 170. The hard coat layer 170 is thus exposed.

At step 104, reactive ion etching is performed to cut through the exposed hard coat layer 170, and underlying regions of the second dielectric layer 160, the etch stop layer 150, the first dielectric layer 140, and, in some cases, the diffusion barrier 130. At step 105, the resist layer 180 is reduced by ashing until only the first, upper level 121 of patterning remains. This thinning action is preferably optimized to minimize the effect on lateral dimension of the pattern or the pattern widening may be compensated in the stamp. The first level 121 of patterning is now coincident with the hard coat layer 170 and the opening corresponds to the desired dimension of the second lithographic operation. At step 106, reactive ion etching is again performed to cut through the exposed hard coat layer 170 and underlying regions of the second dielectric layer 160 to the etch stop layer 150. A cavity 195 having first section spanning the second dielectric layer 160 and a second level spanning the second dielectric layer 140 is thus formed. The remainder of the resist layer 180 is then stripped off.

At step 107, a liner such as Tantalum is homogeneously deposited on the hard coat layer 170 and the inner surfaces of the cavity 195. A plating catalyst is then deposited on the liner. At step 108, Copper 190 is deposited in the cavity 195 to form a via and wire level interconnect. The liner and the catalyst act as a mask for the dielectric layers 160 and 140 during the plating process. Deposition of copper outside the cavity 195 is prevented by selective deactivation of the catalyst. The selective activation may be performed by thiol printing. Thiol printing may be performed by contacting the hard coat layer 170 with an unpatterned thiol inked elastomeric stamp. CMP is then performed to remove excess copper in preparation for further processing. Such further processing may include addition of one or more layers of interconnects.

Figure 3:
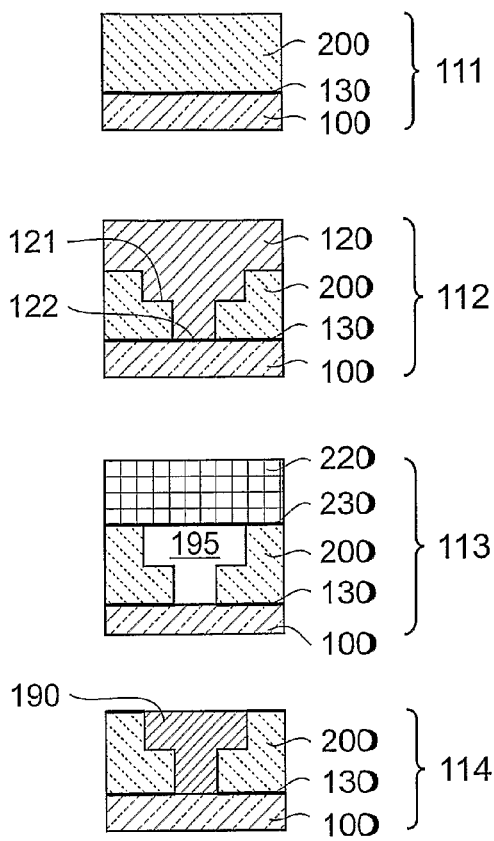
FIG. 3 is a block diagram of another UV molding process embodying the present invention.

Referring to FIG. 3, in another embodiment of the present invention, there is provided a "Single Mold Damascene" process in which, at step 111, a homogeneous layer of the liquid pre-polymer low-k dielectric 200 is deposited directly on the interconnect layer 130 on the substrate 100. The sacrificial polymer resist layer 180 herein before described with reference to FIG. 2 is not used here. Details of possible components of the dielectric layer 200 will be provided shortly. Deposition of the dielectric layer 200 may be achieved by spray coating, spin coating, pipetting or via a roller coater. Other deposition techniques are possible.

At step 112, the transparent patterned stamp 120 is pressed into the dielectric layer 200. The pattern of the stamp 100 is aligned with the substrate 100 in lubricated contact with the dielectric layer 200. Again, alignment may be performed optically through the stamp 120 or additionally by adaptive alignment. Following alignment, the pattern from the stamp 120 is imprinted in the liquid dielectric layer. The patterned dielectric layer 200 is then solidified by UV exposure through the stamp 120. The stamp 120 is now separated from the molded dielectric layer 200.

Ashing is performed to electrically expose a point of contact with any underlying interconnects on the substrate 120. The cavity 195 having substantially the same two level shape as the pattern of the stamp 120 is thus formed in the dielectric layer 200. The second, lowest level of the cavity 195 is coincident with the underlying diffusion barrier 130 or directly with the metal of the underlying interconnect metal. At step 113, a liner 230 such as Tantalum is homogeneously deposited on the dielectric material and the inner surfaces of the cavity. A plating catalyst 220 is deposited on the liner. At step 114, Copper 190 is deposited in the cavity 195 to form a via. The liner 230 and the catalyst 220 act as a mask for the dielectric layer 200 during the plating process. Deposition of Copper outside the cavity 195 is prevented by selective deactivation of the catalyst 220. The selective deactivation may be performed by the aforementioned thiol printing on the dielectric layer 200. CMP is then performed to remove excess copper in preparation for further processing.

The low k dielectric material preferably has a dielectric constant k lower than 3.9 and even more preferably between the values of 2 and 3. In particularly preferred embodiments of the present invention, the low k material comprises aromatic rings such as benzene, silicon-carbon-hydrogen complexes, or the like. Materials comprising carbon and fluorine are less preferable because they are less compatible with other steps in the fabrication process. In particular, fluorine has undesirable corrosive properties. Chlorine has similarly corrosive properties. Hence, materials such as polyvinyl chloride are unattractive. Materials having carbon-hydrogen complexes such as polyethylene are less preferable because these have limited stability at higher temperatures, for example a too low melting point or glass transition temperature. In particularly preferred embodiments of the present invention, the low k material comprises a UV curable cross linking group such as acrylate; hydrosilane; sylanol vinyl; vinyl; hydrosilane thiol; epoxy; styrene; isoprene; sulfones; or urethane. Such groups have dielectric constants in the aforementioned desired range. For example: for polyisoprene, k=2.4; for polystyrene, k=2.6; and, for polysulfone, k=2.1. Generally, aromatic side chains provide desirable thermal stability to the low k material.

Other electrically conductive metals, such as Molybdenum for example, may be deposited in place of Copper. However, Copper is much preferred material. In the embodiments of the present invention herein before described, the second, lower level of the cavity 195 forms a via layer and the first, upper level of the cavity 195 forms a wire level interconnection layer. Single mold Damascene processes embodying the present invention advantageously avoid organic solvent mediated developing or resist strip processes. This widens the range of possible low-k materials and simplifies fabrication. Specifically, Single Mold Damascene processes embodying the present invention involve fewer process steps than conventional Dual Damascene processes. Dual Damascene typically involves, for each interconnect layer, deposition of three silicon nitride layers separated by two layers of dielectric material. Patterning then typically involves two resist spin, expose, develop, etch, and strip cycles. There may be plural interconnect layers each demanding these process steps. Single Mold Damascene processes embodying the present invention involve far fewer process steps for each interconnect layer. Single Mold Damascene processes embodying the present invention do not require silicon nitride etch stop or hard coat layers because UV-molding does not require solvent exposure.

UV molding of porous low-k dielectric material is advantageous because the stamp mechanically defines boundary conditions for nano-pores in the dielectric material. This creates closed surfaces in the cavity. Ashing for the pattern transfer may leave such pores open. As semiconductor feature sizes continue to reduce, it will be increasingly important to close nano pores in the dielectric material, particularly as the feature sizes approach nano-pore dimensions.

UV molding processes embodying the present invention are not restricted to one plane. Instead, UV molding processes embodying the present invention can be performed at different levels simultaneously. Neighboring conductors on a common lithography plane can be staggered to increase spacing and thus reduce capacitance and/or to allow vertical and/or lateral widening of conductors thus reducing resistivity. Because UV molding processes embodying the present invention offer cheaper alternatives to conventional processes, additional interconnection layers may be added to IC designs where it was previously uneconomical to do so. An advantage of embodiments of the present invention herein before described is the inherent alignment among the lithography layers during replication. Here, interlayer alignment accuracy can depend on the accuracy of the stamp fabrication process alone.

The stamp 120 may be formed from a rigid material such as glass, silicon, or quartz. For example, the stamp 120 may be formed by e-beam or photolithographic patterning and reactive ion etching of a silicon oxide layer on a silicon substrate. The oxide layer is first photopatterned. The patterned oxide then forms a selective barrier against etching of the underlying silicon. The pattern is transferred to the silicon by the etching. The patterned silicon may be coated with a plasma Teflon layer. The Teflon facilitates trivial release of the stamp 120 from materials into which it is subsequently pressed and reduces wear during operation.

The master for molding the stamp 120 or the stamp 120 may be fabricated by e-beam lithography. For example, the master may be formed on a silicon substrate. A first resist layer is deposited on the substrate. The first resist layer is then selectively exposed to by e-beam defining a first level of patterning. A second resist layer is then deposited on the substrate. The second resist layer is then selectively exposed by e-beam defining a second level of patterning. The first and second resist layers are then developed in combination to leave the second level of patterning superimposed on the first level of patterning. The combined pattern thus comprises two levels. Again a plasma Teflon layer is deposited on the combined pattern to complete the stamp. The first and second resist layers may be deposited by spinning on the like.

Alternatively, the stamp 120 may be formed from an elastomeric material such as rubber or PDMS. PDMS hardness is advantageously tunable. Both rigid and elastomeric stamps can achieve similar pattern sizes. Feature sizes of around 35 nm are possible. Experiments indicate that examples of the present invention can achieve relatively large area moldings with feature sizes of, for example, 130 nm over an 8 cm diameter substrate, with a relatively high aspect ratio based on a pattern height of around 200 nm, and with surprisingly good side wall definition. Elastomeric stamps make conformal contact with the substrate. The conformal contact is advantageously defect tolerant. This allows higher yields than possible with rigid stamps, especially for relatively large area moldings. Another advantage is that release of elastomeric stamps from molded material is trivial even for high aspect ratio features with vertical side walls.

Embodiments of the present invention have been herein before described with reference to the fabrication of multi-level IC interconnects. However, the present invention is equally applicable to the fabrication of many other multilevel structures. One such structure is the multilevel stamp 120 herein before described with reference to FIGS. 2 and 3. Such a stamp may be formed by pressing a master into curable material. The master is preferably formed from an elastomeric material. An advantage of molding stamps from an elastomeric master is that many stamps can be replicated from the master without risk of damage to the master. A elastomeric master facilitates efficient release of molded stamps even when the molded stamps include vertical or corrugated side walls. Such features may bond permanently to rigid masters.

In a preferred embodiment of the present invention, the stamp 120 is molded from a transparent elastomeric master having a pattern comprising first and second lithography levels. Initially, a substrate carrying a blank from which the stamp 120 will be formed is coated with a homogeneous layer of UV curable liquid pre-polymer resist. The master is then brought into contact with the resist layer and aligned with respect to the blank. Optical alignment through the master may be employed. The pattern on the master is then pressed into the resist layer. The patterned resist layer is solidified by exposure to UV through the master. The master is then released from the cured resist layer. Any residual resist is removed by ashing. At this stage, the topography of the cured resist layer substantially matches the pattern of the master. The first level of the pattern is now transferred to the blank by ion milling based on the first level of the pattern in the resist layer. Ashing is performed to remove the resist layer to the second level of the pattern. Ion milling is now performed with only the second level of the pattern in the resist layer present. Remaining resist is removed to expose the stamp 120. It will also be appreciated that the stamp 120 may be provided with more than two levels of patterning via this technique.

Figure 4:
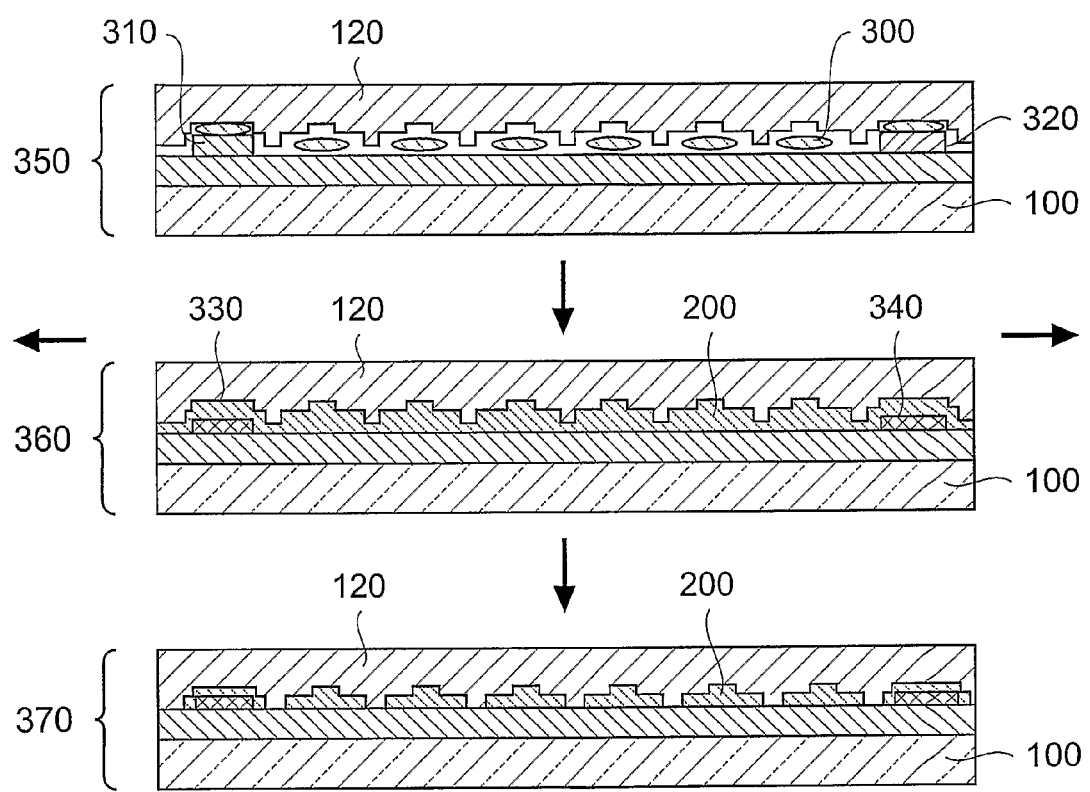
FIG. 4 is a block diagram of yet another UV molding process embodying the present invention; and, FIG. 5 is another block diagram of the UV molding process associated with FIG. 4.

As indicated on occasions earlier, optical alignment may be employed to position the stamp 120 relative to the substrate carrying the material to be shaped. In preferred embodiments of the present invention, the stamp 120 is formed from an elastomeric material and mechanical alignment is employed to enhance or replace the optical alignment of the stamp 120 relative to the substrate. Referring to FIG. 4, in a particularly preferred embodiment of the present invention, the substrate 100 carries a plurality of spaced protrusions 310,320 from the surface on which the structure is to be formed. The protrusions 310,320 correspond to complementary recesses 330, 340 in the patterning of the stamp 120.

Initially, at step 350, droplets 300 of UV curable liquid pre-polymer are deposited on the surface of the substrate 100 and on the protrusions 310,320. The droplets 300 may be deposited by, for example, pipetting. In other embodiments of the present invention, the liquid pre-polymer may be deposited in another form, such as a homogenous layer but with exactly measured amount such that no long distance lateral flow of prepolymer is needed during the molding. At step 360, the stamp 120 is pressed into contact with the deposited pre-polymer in such a manner that the recesses 330,340 on the stamp 120 are generally aligned with protrusions 310,320 on the substrate 100. Optical techniques may be employed in the general alignment. As the stamp 120 is pressed towards the substrate 100, the intervening liquid polymer deposits merge to form a homogeneous layer 200. The layer of polymer 200 lubricates the contact between the stamp 120 and the substrate 100 to reduce friction between the stamp 120 and the substrate 100 and thus to facilitate lateral movement of the stamp 120 relative to the substrate 100. The spacing between adjacent protrusions 310,320 on the substrate 100 is slightly greater than that between corresponding recesses 330,340 on the stamp 120, so that the stamp is laterally stretched as the recesses 330,340 become seated over protrusions 310,320, at step 370. The elastomeric material from which the stamp 120 is formed accommodates such stretching. The lateral stretching improves the accuracy with which the pattern on the stamp 120 is positioned relative the substrate 100 and thus improves the accuracy with which the pre-polymer is shaped. It is noted that the stamp can be stretched or compressed depending on fabrication or process induced mismatches between wafer and stamp.

The protrusions 310,320 and corresponding formations 330,340 may be conical or frusto-conical in form. However, conical and frusto-conical shapes are relatively difficult to produce. In a preferred embodiment of the present invention therefore, a protrusions 310,320 and recesses 330,340 have sides extending orthogonal to the surfaces of the substrate 120 and the stamp 100 respectively. To approximate to a conical shape, and thus achieve a similar stretching and alignment effect, the extremity of each protrusion comprises an inward step defining a narrow end akin to the apex of a cone. The protrusions and recess may circular or square in plan view. In other embodiments of the present invention, the recesses may be formed in the substrate 100 and the corresponding protrusions may be formed in the stamp 120. It will be appreciated that other forms of complementary formations may provided on the stamp 120 and the substrate 100 to produce the mechanical stretching and alignment effects herein before described.

Figure 5:
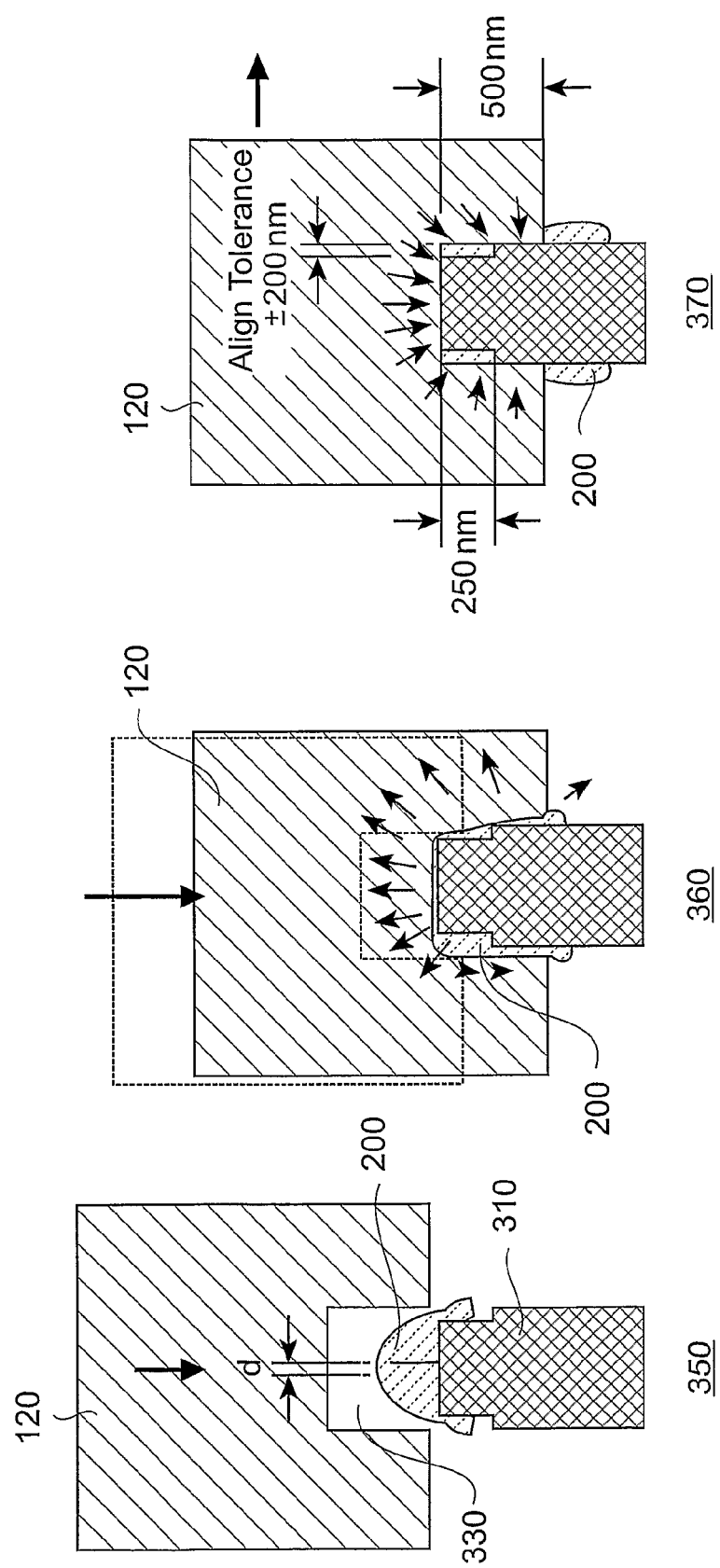

Referring to FIG. 5, in a particularly preferred embodiment of the present invention, the centre of each recess 330 in the stamp 120 is offset from the centre of the corresponding protrusion 310 on the substrate 100 by a displacement d. Displacement d may, for example, be around 200 nm. An excess of lubricating liquid pre-polymer 200 is deposited on the end of each protrusion 310. As the stamp 120 and the substrate are brought together, each protrusion 310 on the substrate 100 enters the corresponding recess 330. The entry is eased by the narrower end region of the protrusion 310. Each recess 330 is expanded in the direction of the displacement d to accommodate the corresponding protrusion 310. Lateral forces are thus produced in the stamp 120 against the elasticity of the stamp material. The expansion of each recess 330 provides an exit path for excess pre-polymer, allowing escape of the excess pre-polymer under the elastic pressure imposed by the stamp material. The elastic pressure in each recess 330 is associated with a relatively restoring force in the stamp material. The restoring force tends to close each recess 330 around the corresponding protrusion 310. When fully closed, the offset between each recess and the corresponding protrusion produces an aligning tension in the stamp material and, in particular, the patterning formed in the stamp material. The depth of each recess 330 may be around 500 nm for protrusions having an narrower end of around 250 nm length with around 200 nm between the width of the protrusion at its extremity and the width of the protrusion at the surface of the substrate 100. Other dimensions are clearly possible.

Contact lithography processes embodying the present invention may also provide improved approaches for applying precursor materials for catalysts and liners such as diffusion and electromigration barriers.

The invention claimed is:

1. A method for forming a multilevel patterned mask structure on a substrate surface to pattern said substrate, the method comprising the steps of:
   depositing a curable liquid layer on the substrate surface;
   aligning a stamp relative to the substrate surface via complementary formations on the stamp and the surface;
   pressing the stamp having a multilevel pattern therein into the liquid layer to produce in the liquid layer a multilevel patterned mask structure defined by the pattern;
   curing the liquid layer to produce a solid layer having the multilevel patterned mask structure therein;
   removing the stamp; and
   performing at least one subtractive processing through said multilevel patterned mask to pattern said substrate.

2. A method as claimed in claim 1, wherein the aligning comprises lubricating movement of the stamp relative to the surface via the liquid layer.

3. A method as claimed in claim 2, wherein the complementary formations comprise protrusions on one of the stamp and the surface and recessed for receiving the protrusions on the other of the stamp and the surface.

4. A method as claimed in claim 3, wherein the stamp is formed from an elastomeric material.

5. A method as claimed in claim 4, wherein the aligning comprises stretching the stamp.

6. The method as claimed in claim 1, wherein the protrusions are offset relative to the corresponding recesses to produce deformation of the stamp.

7. The method as claimed in claim 1, wherein the depositing comprises depositing an excess of the liquid comprising the liquid layer on the protrusions.

8. The method as claimed in claim 7, wherein the aligning comprises expansion of the recesses in the direction of the offset when brought into contact with corresponding protrusions, the elasticity of the stamp providing an exit path for the excess liquid and allowing each recess to close around a corresponding protrusions.

9. The method as claimed in claim 1 wherein the solid layer is formed from a dielectric material and the multilevel structure comprises a multilevel cavity in the solid layer.

10. The method as claimed in claim 1 wherein the solid layer is formed from a resist material, the multilevel structure comprises a multilevel cavity in the solid layer, and the depositing comprises depositing a resist material in liquid form on a dielectric layer.

11. The method as claimed in claim 10 further comprising etching the dielectric layer via the solid layer to transfer the cavity from the solid layer to the dielectric layer.

12. The method as claimed in claim 9 further comprising depositing metal in the cavity to produce a conductive structure embedded in the dielectric material.

13. The method as claimed in claim 12 further comprising performing thiol printing on the dielectric layer, thereby to prevent deposition of metal outside of the cavity.

14. The method as claimed in claim 12 wherein the cavity comprises a first level corresponding to a longitudinal element of the conductive structure and a second level corresponding to a lateral element of the conductive structure.

15. The method as claimed in claim 14 wherein the longitudinal element comprises a via for completing an electrical connection between adjacent levels of a multilevel interconnection structure for an integrated circuit, and the lateral element comprises a wire for completing an electrical connection with one of the adjacent levels of the integrated circuit.

16. The method as claimed in claim 1 wherein the stamp comprises an optically transparent stamp and wherein curing comprises exposing the liquid layer to ultraviolet light through the optically transparent stamp.

17. A method for fabricating an integrated circuit having a multilevel interconnection structure, the method comprising between at least one pair of adjacent levels of the interconnection structure, forming an electrically conductive structure by performing a method comprising the steps of:
   depositing a curable liquid layer on a substrate surface;
   aligning a stamp relative to the substrate surface;
   pressing the stamp having a multilevel pattern therein into the liquid layer to produce in the liquid layer a multilevel structure defined by the pattern;
   curing the liquid layer to produce a multilevel patterned mask in said solid layer having the multilevel structure therein;
   removing the stamp; and
   performing at least one subtractive processing through said multilevel patterned mask to pattern said substrate; and
   performing at least one additive processing to deposit conductive material for said multilevel interconnection structure.

* * * * *